Figure 1:
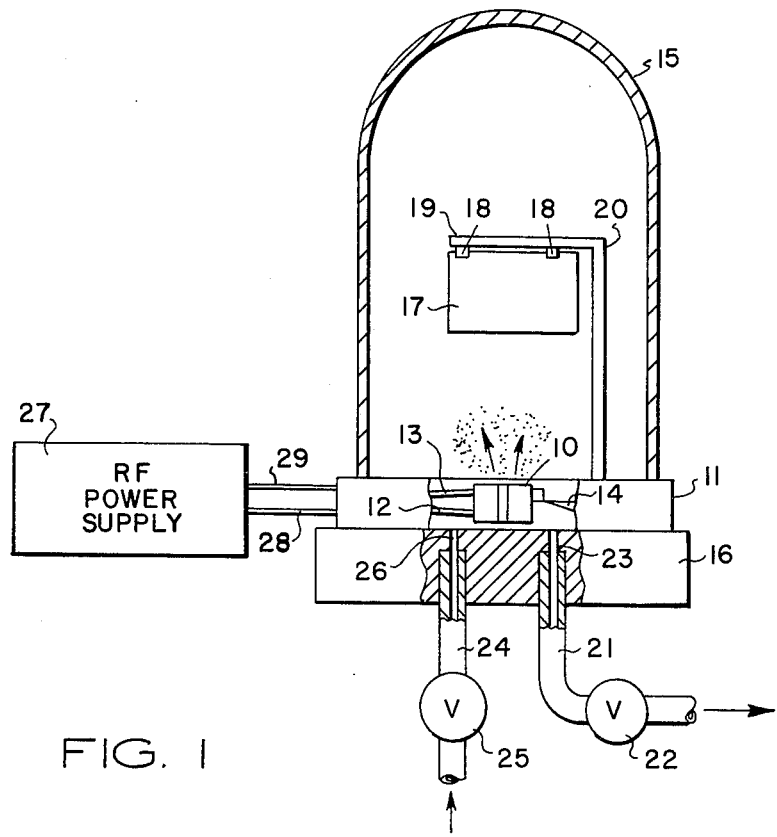

United States Patent [19]

White

[11] 4,039,416
[45] Aug. 2, 1977

[54] GASLESS ION PLATING

[76] Inventor: Gerald W. White, 5835 Elm Lawn St., Dallas, Tex. 75228

[21] Appl. No.: 569,679

[22] Filed: Apr. 21, 1975

[51] Int. Cl.$^2$ .................. C23C 15/00; C23C 13/12
[52] U.S. Cl. .................. 204/192 N; 118/49.1; 118/49.5; 204/298; 427/39; 427/45; 427/50
[58] Field of Search .................. 204/192, 298; 427/38, 427/39, 50, 45; 118/49.1, 49.5

[56] References Cited

U.S. PATENT DOCUMENTS

| 2,443,196 | 6/1948 | Raines et al. | 427/45 |
| 3,461,054 | 8/1969 | Vratny | 204/192 |
| 3,492,215 | 1/1970 | Conant | 204/192 |
| 3,736,175 | 5/1973 | Carleton | 427/45 |
| 3,962,988 | 6/1976 | Murayama et al. | 118/49.1 |
| 3,968,019 | 7/1976 | Hanazono et al. | 204/192 |

FOREIGN PATENT DOCUMENTS

| 284,555 | 2/1971 | U.S.S.R. | 118/49.1 |

OTHER PUBLICATIONS

D. M. Mattox, "Fundamentals of Ion Plating", J. Vac. Sci. Technol; vol. 10, No. 1, Jan. Feb. 1973, pp. 47-52.

L. Leder, "Fundamental Parameters of Ion Plating, Metal Finishing", pp. 41-45, Mar. 1974.
Berry et al., "Thin Film Technology", pp. 156-157, 142-144, Van Nostrand Reinhold, N.Y. 1968.
S. Aisenberg et al., "Physics of Ion Plating & Ion Beam Deposition", J. Vac. Sci. Technol; vol. 10, No. 1, Jan. Feb. 1973, pp. 104-107.

Primary Examiner—John H. Mack
Assistant Examiner—Aaron Weisstuch
Attorney, Agent, or Firm—Warren H. Kintzinger

[57] ABSTRACT

A gasless ion plating process wherein plating material is melted, vaporized, and then subjected to an ionization environment in a low pressure chamber with a "virtual cathode" consisting of a plasma of ionized atoms of evaporant material created by evaporating in an RF field. It is a gasless ion plating process wherein the system ambient pressure prior to plating material evaporation may be much lower than that required to sustain a glow discharge, however, with vapor pressure of evaporant material added to the environment base pressure being such as to result in a plasma of ionized atoms of the plating material developing as the vaporized material approaches the RF cathode.

15 Claims, 2 Drawing Figures

U.S. Patent    Aug. 2, 1977    4,039,416

GASLESS ION PLATING

This invention relates in general to high particulate energy level ion plating deposition of plating material, and in particular, to gasless ion plating. Various high-rate ion plating sources advantageously suited to applicant's gasless ion plating process are disclosed in applicant's co-pending application entitled, "High Rate Ion Plating Source, " Application Ser. No. 551,703, filed Feb. 21, 1975, in addition to electron gun, filament and boat type sources, among other known sources.

In the application of protective coatings to substrates, vacuum evaporation systems, sputtering, and classical ion plating have been used in the past with varying degrees of success. Vacuum evaporation provides high deposition rates, but has the disadvantage of being a "line-of-sight" process. Three-dimensional uniformity is very difficult to achieve and requires expensive tooling-and such deposited coating results in poorly bonded columnar grains. Further, since there is no particle acceleration involved in the vapor deposition, adhesion can frequently be a problem. To some extent, sputtering overcomes the "line-of-sight" problem, and offers a wide variety of materials, film stoichiometry, and generally better adhesion, than does vapor deposition. There are, however, serious problems with slow deposition rates and three-dimensional uniformity. An often overlooked problem with sputtering is the decreased energy of the deposited atom. Sputtering is a secondary process. An ion of inert gas is born in a plasma, at a space charge depression of typically +80 to +100 volts. Only after an inelastic collision with the target, is an atom of target material released for useful coating. The neutral atom must then migrate back across the dark space, through the plasma, onto the substrate. In the process, numerous collisions deplete the atom's energy. Thus, in its journey to the substrate, the inert gas that heretofore has been considered essential for maintaining the plasma and removing the target material, becomes a hindrance to the liberated atom of coating material. Additionally, a considerable amount of this inert gas becomes included in the deposited film. Classical ion plating-as described, for example, in Mattox, U.S. Pat. No. 3,329,601—provides some of the advantages of the previous two methods, but is entirely dependent upon an inert gas that is introduced into the system to maintain the plasma. The classical ion plating system ionizes only about 20% of the evaporated material. Further, the full effect of the gas upon the coating and/or substrate is unknown.

It is therefore a principal object of this invention to provide an improved plating system.

Another object is to provide a plating system with high deposition rates.

A further object is to provide a plating system not subject to degradation caused by inert gases.

A still further object is to provide a plating system which coats small internal diameters and irregularly shaped cavities of a substrate.

Still another object of this invention is to provide a plating process for plating a wide variety of materials, both conductive and non-conductive.

Features of this invention useful in accomplishing the above objects include a plating system utilizing a high rate ion source, operable in a vacuum. The ion source is instrumental in converting the plating material to the form of a plasma forming a "virtual" cathode in the region of the substrate.

Figure 2:
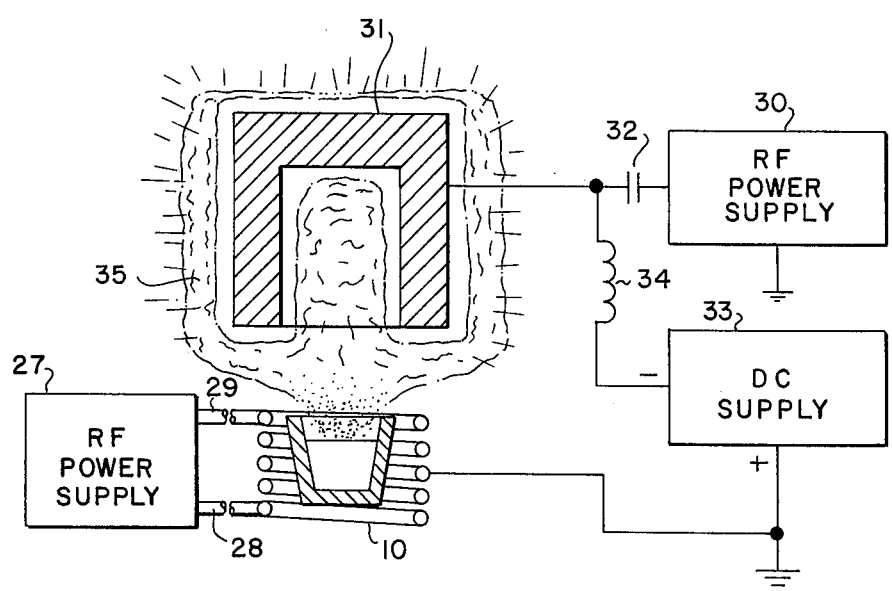

A specific embodiment representing what is presently regarded as the best mode of carrying out the invention is illustrated in the accompanying drawing:

In the drawing:

FIG. 1 represents a partially broken away and sectional view of a gasless ion plating system constructed in accordance with the principles of this invention; and, FIG. 2, an illustrative representation of the operation of the system of FIG. 1, including the application of bias voltage to a conductive substrate, for plating thereof.

Referring to the drawing:

A high rate ion plating source 10 that functions as a material vaporizing and ion generation source, for controlled environment material ion plating, is supported by feedthrough ring 11, with the power feed conduits 12 and 13 and combination ground connection and support bracket 14. Such a source is disclosed, for example, in my co-pending application entitled, "High Rate Ion Plating Source," application Ser. No. 551,703, filed Feb. 21, 1975. It is expressly understood that any other source may be utilized without departing from the principles of this invention. Feedthrough ring 11, along with bell jar 15 and base 16 supporting feedthrough ring 11, together, provide a closed, controlled-environment, enclosure. Substrate items 17, to be ion plated, are suspended by clamps 18 from the mounting arm 19 of mounting post 20, anchored in base 16. Evacuation line 21, with valve 22, is connected to opening 23 in base 16 for enclosure by an evacuation pump (not shown), connected through line 21, with the controlled environment bell jar enclosure. A gas supply line 24 with a metering control valve 25 is connected through opening 26 in base 16 for feeding a gas from a single gas source (not shown), or selected gases from a plurality of gas sources that valve-control feed the line 24. Radio frequency power supply 27 feeds power through hollow, tubular, copper lines 28 and 29, and on through conduits 12 and 13, to ion source 10.

In operation, the system represented in FIG. 1 is first evacuated through evacuation line 21. Radio frequency power is supplied to ion source 10 from supply 27 to create a plasma of evaporated and ionized deposition material, as described in the aforementioned application. If substrate 17 is an insulator, the well known DC self-bias effect that occurs when an insulator is placed in a radio frequency field, causes a negative self-bias to occur on the surface of the substrate 17. When plating a conductive substrate, it is necessary to induce a bias on the substrate from an external source. This is accomplished as shown in FIG. 2, where radio frequency power supply 30 is connected to substrate 31 through capacitor 32, and DC supply 33 provides a negative bias to substrate 31 through RF choke coil 34. In a typical plating operation, radio frequency power supply 27 was operated at a frequency of 450 kilohertz, and radio power supply 30 supplied on RF signal of 13.5 megahertz. These frequencies are only illustrative, and may be adjustably varied to apply to specific applications. As shown in FIG. 2, ion source 10 vaporizes plating material that then forms an ionized plasma 35, due to the action of the radio frequency field. Plasma 35, with its uniform density of ions and accompanying dark space, tends to follow the geometry of a negatively charged substrate 31, forming a "virtual cathode" for sputtering. The quality of the plasma allows for full, three-dimensional, coverage for even the most irregular surfaces—including the inside of small-diameter holes.

Classical ion plating requires that an inert gas (usually Argon) be bled into the chamber to maintain the plasma. Using a high rate ion source, such as manufactured by Endurex Corporation, Dallas, Tex., and described in the aforementioned co-pending patent application, the plasma is made up of the evaporant, itself, and no gas needs to be bled into the system. With this system, approximately 75% of the evaporant is ionized. With the system shown in FIG. 2, the radio frequency and direct current bias on substrate 31 helps shape the plasma "virtual" cathode in optimizing the deposition of metal plating materials and dielectric materials. The dark space is formed, substantially as in radio frequency sputtering, except that primary ions of the coating material, with high sticking probability—instead of Argon-sputtering ions—are accelerated across the dark space.

If it is desired to clean the substrate prior to plating, Argon gas may be admitted into the chamber through gas supply line 24, and back sputtering can then be performed. Further, other gases could be admitted for controlled thermochemical, metalurgical, and/or physical process purposes, in intermediate plating process steps prior to, between, or after, gasless ion plating, in various compound ion plating processes.

With the above-described system, a wide variety of materials can be plated, including even paper, plastic, and textiles; and the materials may be either conductive or non-conductive. To prevent damage to temperature-sensitive substrates, a heat shield may be placed between the high temperature ion source and the substrate. The ionized plating material plasma moves around the shield to plate on the substrate.

Whereas this invention is herein illustrated and described with respect to several embodiments hereof, it should be realized that various changes may be made without departing from essential contributions to the art made by the teachings hereof.

I claim:

1. A process for ion plating a substrate supported within a chamber with a plating material and in the absence of any inert gas inputted to said chamber, comprising the steps of: evacuating said chamber; vaporizing plating material in the evacuated chamber, developing a direct current negative bias on said substrate, and applying a radio frequency field from a first radio frequency source to the vaporized plating material within said chamber.

2. The ion plating process of claim 1, wherein said substrate is conductive, and said step of developing a direct current negative bias on said substrate comprises the application of a direct current negative bias source to said substrate.

3. The ion plating process of claim 2, further including the application of a further radio frequency signal source to said substrate.

4. The process of claim 3, wherein said radio frequency field applied within said chamber is at a frequency within the range of approximately 10 to 800 kilohertz, and said further radio frequency signal applied to the substrate is in the range of approximately 2 to 40 megahertz.

5. The process of claim 1, wherein the substrate is to be cleaned prior to plating, further comprising the preliminary steps of: evacuating said chamber; introducing an inert gas into said chamber; and applying a radio frequency field to an area within said chamber.

6. The process of claim 1, wherein the step of vaporizing is a result of the step of applying the radio frequency field.

7. A process for plating a substrate supported within a chamber with a plating material comprising the steps of: evacuating said chamber; vaporizing said plating material in the evacuated chamber; developing a direct current negative bias on said substrate; forming and maintaining an ionized plasma from the vaporized plating material in the absence of any inert gas inputted to said chamber; and applying a radio frequency field within said chamber to ion plate said material from said plasma onto said substrate.

8. The process of claim 7, wherein the steps of vaporizing plating material, forming an ionized plasma, and applying a radio frequency field, are performed concurrently from a single radio frequency power supply.

9. Apparatus for plating a conductive substrate with a plating material, including: a chamber adapted to hold said substrate and said plating material; means for evacuating said chamber; means for vaporizing said plating material in the evacuated chamber; means for applying radio frequency power to the vaporized plating material to form and maintain an ionized plasma therefrom in the absence of any inert gas inputted to said chamber; a radio frequency bias source means connected to said substrate; and means for applying a direct current negative bias to said substrate.

10. The apparatus of claim 9, further including connection of said radio frequency bias source means through a radio frequency coupling capacitive means to said substrate.

11. The apparatus of claim 10, wherein said means for applying a direct current negative bias to said substrate includes a direct current source having a negative terminal connection through RF choke means to said substrate and a positive terminal connection to a voltage potential reference source of the system.

12. The apparatus of claim 9, wherein said radio frequency power is at a frequency of about 450 kilohertz, and including means for applying a further radio frequency bias source means at a frequency of about 13.5 megahertz to said substrate.

13. The apparatus of claim 9, wherein the vaporizing means is a conventional resistance heat element device.

14. The apparatus of claim 13, wherein said vaporizing means is a filament device.

15. The apparatus of claim 13, wherein said vaporizing means is a boat.

* * * * *